(12) United States Patent
Sekine et al.

(10) Patent No.: US 6,249,242 B1
(45) Date of Patent: Jun. 19, 2001

(54) HIGH-FREQUENCY TRANSMITTER-RECEIVER APPARATUS FOR SUCH AN APPLICATION AS VEHICLE-ONBOARD RADAR SYSTEM

(75) Inventors: Kenji Sekine, Tokyo; Hiroshi Kondoh, Fuchu; Keigo Kamozaki, Urawa; Hideyuki Nagaishi, Hachioji; Kazuo Matsuura, Hitachinaka; Terumi Nakazawa, Ibaraki-ken; Michio Tanimoto, Kokubunji; Hideaki Sasaki, Hadano; Yuzo Taniguchi, Kodaira, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/369,400

(22) Filed: Aug. 6, 1999

(30) Foreign Application Priority Data

Aug. 7, 1998 (JP) .................................................. 10-224006
Jan. 12, 1999 (JP) .................................................. 11-004949

(51) Int. Cl.$^7$ ...................................................... G01S 13/93
(52) U.S. Cl. .................... 342/70; 342/175; 343/700 MS
(58) Field of Search ............... 342/175, 70; 343/700 MS

(56) References Cited

U.S. PATENT DOCUMENTS

| 3,818,386 | * | 6/1974 | Granberry | ................................ | 333/33 |
|---|---|---|---|---|---|
| 4,398,199 | * | 8/1983 | Makimoto et al. | ........... | 343/700 MS |
| 4,510,498 | * | 4/1985 | Mori et al. | ................. | 343/700 MS X |
| 4,635,006 | * | 1/1987 | Mori et al. | ............................ | 342/435 |
| 4,907,006 | * | 3/1990 | Nishikawa et al. | ........... | 343/700 MS |
| 5,087,920 | * | 2/1992 | Tsurumaru et al. | .......... | 343/700 MS |
| 5,432,524 | * | 7/1995 | Sydor | ................................... | 343/765 |
| 5,706,015 | * | 1/1998 | Chen et al. | .................... | 343/700 MS |
| 5,760,749 | * | 6/1998 | Minowa et al. | ..................... | 343/772 |
| 5,896,107 | * | 4/1999 | Huyuh | ........................... | 343/700 MS |
| 6,008,750 | * | 12/1999 | Cottle et al. | ............................ | 342/42 |

FOREIGN PATENT DOCUMENTS

0978729 A2 * 2/2000 (EP) .
8-250913 9/1996 (JP) .

OTHER PUBLICATIONS

Watanabe et al., "60GHz Band RF Unit for Millimeter–wave Radar", Proceedings of 1997 IEICE Convention, Paper No. C–2–2121.

* cited by examiner

Primary Examiner—John B. Sotomayor
(74) Attorney, Agent, or Firm—Antonelli, Terry, Stout & Kraus, LLP

(57) ABSTRACT

A high-frequency transmitter-receiver apparatus includes a transceiver circuit realized in a planar structure by a dielectric substrate and a semiconductor chip and a planar antenna formed on a dielectric substrate are provided on front and rear surfaces, respectively, of a single electrically conductive base plate. Signal lines of the planar circuit and the planar antenna are electrically interconnected by a coaxial line which extends through said base plate.

37 Claims, 11 Drawing Sheets

HIGH-FREQUENCY TRANSMITTER-RECEIVER APPARATUS FOR SUCH AN APPLICATION AS VEHICLE-ONBOARD RADAR SYSTEM

BACKGROUND OF THE INVENTION

The present invention relates generally to a high-frequency transmitter-receiver apparatus which can be employed as a radar for an automobile or motor vehicle, a communication device in a wireless LAN (local area network) and others. Further, the present invention is concerned with an antenna unit incorporating a high-frequency transmitter-receiver device and a vehicle-onboard radar system incorporating the same.

For the high-frequency transmitter-receiver apparatus employed as the vehicle radar, the wireless LAN or the like, it is important to realize the high-frequency transmitter-receiver apparatus in a miniaturized and simplified structure from the standpoint of mountability and portability of the apparatus.

As one of the conventional high-frequency transmitter-receiver apparatuses designed for use as a radar for a motor vehicle, there can be mentioned the apparatus disclosed in "Proceedings of 1997 IEICE (Institute of Electronics, Information and Communication Engineers) Convention, Paper No. C-2-121: 60 GHz-BAND MILLIMETER-WAVE BAND RADAR UNIT" (hereinafter referred to as the prior art reference 1). In this known transmitter-receiver apparatus, a millimeter-wave (60 GHz band) transmitter-receiver circuit or transceiver circuit is realized as a discrete transmitter-receiver unit encased within a housing. On the other hand, an antenna unit is also realized as a discrete unit and adapted to be connected to the transceiver circuit unit. More specifically, a waveguide terminal serving as input/output terminal for the radio-frequency or RF signal is provided on a rear or bottom surface of the transmitter-receiver unit. Similarly, the antenna unit is equipped with a corresponding waveguide terminal. Thus, the transmitter-receiver unit and the antenna unit can be electrically interconnected by using a waveguide.

Further, in JP-A-8-250913 (hereinafter referred to as the prior art reference 2), there is disclosed a high-frequency transmitter-receiver apparatus in which a planar antenna is formed on an outer surface of a package in which a monolithic microwave integrated circuit (hereinafter referred as MMIC) is hermetically accommodated. FIG. 18 of the accompanying drawings shows a structure of the same. As can be seen in the figure, an antenna 142 is mounted on a bottom surface 141 of the package while a MMIC 143 is mounted as embedded within the package in opposition to the antenna 142. The bottom surface of the MMIC package 143, that is, the top surface of the MMIC package 143 as viewed in the figure, is provided with a slot 146 formed by removing partially a ground conductor layer 145. A conductor pattern 144 constituting a part of a high-frequency circuit and provided on the bottom surface of the MMIC package 143 and the antenna 142 are coupled electromagnetically through the medium of the slot 146. A bonding pad 147 provided on the surface of the MMIC package 143 and a power source terminal 149 also provided on the same surface for receiving external power supply are electrically interconnected by a bonding wire 148.

SUMMARY OF THE INVENTION

According to the technique described in the prior art reference 1, the transceiver unit and the antenna unit designed and realized discretely from each other are interconnected for constituting the high-frequency transmitter-receiver apparatus. This structure is certainly advantageous in that the characteristics of the transceiver unit and the antenna unit can be evaluated independently of each other. However, a large number of parts are required with the structure being complicated, which makes it difficult to realize the high-frequency transmitter-receiver apparatus in a miniaturized and simplified structure. In particular, coupling of the discrete units through the waveguide in a very high frequency band such as a millimeter wave band involves complexity in machining the waveguide, terminals and others, giving rise to a problem of high manufacturing cost.

On the other hand, according to the teachings disclosed in the prior art reference 2, the high-frequency transceiver circuit and the antenna are electromagnetically coupled through the slot. With such contactless coupling, insertion loss of the high-frequency signal tends to increase. In order to suppress such insertion loss, the thickness of the electrically conductive plate 141 disposed between the antenna and the high-frequency transceiver circuit has to be reduced to be as thin as possible. By way of example, it is reported that in the case of the high-frequency transmitter-receiver apparatus for the signal of 10 GHz, the thickness of the electrically conductive plate mentioned above is on the order of 0.5 to 0.7 mm. Thus, for the signal of millimeter wave band (ca. 60 GHz), the thickness of the electrically conductive plate has to be further decreased. Consequently, a great difficulty will be encountered in sustaining a desired mechanical strength with the structure in which the antenna and the high-frequency circuit are provided, respectively, on both surfaces of the conductive plate. In other words, some reinforcing mechanism or structure will be required. Besides, the electromagnetic coupling of the signal of short wavelength such as millimeter-wave requires high dimensional precision for realizing the slot as well as high-precision positioning of the antenna pattern 142 and the high-frequency circuit pattern 144, which of course imposes not a little burden on the assembling work. Additionally, in order to assure reliability of the MMIC, the whole package must be implemented in a hermetically sealed structure, which renders the assembling work more difficult.

In the light of the state of the art described above, it is an object of the present invention to provide a high-frequency transmitter-receiver apparatus which can essentially evade the problems of the conventional apparatus mentioned above.

Another object of the present invention is to provide an antenna unit which incorporates as an integral part thereof a high-frequency transmitter-receiver device and in which the problems such as mentioned above are solved satisfactorily.

It is yet another object of the present invention to provide a radar system in which the antenna unit mentioned above is employed.

In view of the above and other objects which will become more apparent as the description proceeds, there is provided according to an aspect of the present invention, a high-frequency transmitter-receiver apparatus in which a high-frequency transceiver circuit composed of an oscillator, an amplifier, a mixer circuit and the like is realized in the form of a planar circuit structure by using a dielectric substrate and a semiconductor chip, while an antenna for transmitting and receiving a high-frequency signal is realized as a planar antenna by using a dielectric substrate, wherein the dielectric substrate constituting a part of the planar circuit structure and the dielectric substrate constituting a part of the planar antenna are directly bonded on first and second surfaces, respectively, of a single electrically conductive base plate, the first and second surfaces being opposite to each other, and wherein high-frequency signal lines of the planar circuit and the planar antenna, respectively, are interconnected by an coaxial line which extends through the base plate.

By virtue of the arrangement described above, there can be realized a unitary structure in which the transceiver circuit and the antenna are combined integrally with each other, whereby the factors contributing to deterioration of the characteristics can be diminished with the number of parts being decreased. Besides, the apparatus can be miniaturized as a whole.

In a mode for carrying out the present invention, those portions of the coaxial line (coaxial cable) where the coaxial line is connected, respectively, to the dielectric substrate constituting a part of the planar circuit structure and the dielectric substrate constituting a part of the planar antenna structure should preferably be realized in an airtight structure by using a dielectric such as glass, ceramic or the like.

In that case, the transceiver circuit structure including the semiconductor chip can be realized in a hermetically sealed structure without any appreciable difficulty.

Furthermore, according to another aspect of the present invention, there is provided a high-frequency transmitter-receiver apparatus which includes a base plate, an antenna provided on a first surface of the base plate, a transceiver circuit provided on a second surface of the base plate opposite to the first surface and electrically connected to the antenna, and a terminal for external connection provided on the second surface of the base plate for supplying a source current to the transceiver circuit or outputting an electric signal. The base plate is provided with a concave portion in the first surface and covered with the antenna and a through-hole extending through the concave portion and the second surface. A connecting terminal for supplying a source current to the transceiver circuit or outputting a signal extends through the through-hole and connected to the terminal for external connection in the concave portion. The connecting terminal is implemented in a line structure having a metal conductor electrically insulated from the base plate in the through-hole.

In a preferred mode for carrying out the present invention, the coaxial line interconnecting the high-frequency transceiver circuit and the antenna on one hand and the coaxial line for the terminal for receiving D.C. bias or power supply and/or the input/output terminal for an IF (intermediate frequency) signal on the other hand should be realized in a same structure and disposed in a same orientation. Owing to such arrangement, the work efficiency in assembling the apparatus can be enhanced, and additionally common use of the circuit components can be achieved. By way of example, the coaxial line of a same structure can be used not only as the connecting terminal but also for interconnection of the transceiver circuit and the antenna. Besides, the transceiver circuit including the semiconductor chip can be realized in a hermetically sealed structure without any appreciable difficulty.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which:

FIGS. 10A and 10B show a structure of a mid portion of a base plate of a high-frequency transmitter-receiver apparatus according to an embodiment of the present invention, in which FIG. 10A is a top plan view of the same, and FIG. 10B is a sectional view taken along a line A-B shown in FIG. 10A;

FIGS. 15A and 15B show a structure of a high-frequency transmitter-receiver apparatus according to a yet further embodiment of the present invention, wherein FIG. 15A is a circuit diagram showing a high-frequency (RF) circuit and FIG. 15B shows a circuit pattern;

FIGS. 16A and 16B shows a structure of a high-frequency transmitter-receiver apparatus according to a still further embodiment of the present invention, wherein FIG. 16A is a circuit diagram showing a high-frequency (RF) circuit and FIG. 16B shows a circuit pattern thereof;

FIGS. 17A and 17B show a high-frequency transmitter-receiver apparatus according to another embodiment of the present invention, wherein FIG. 17A is a circuit diagram showing a high-frequency (RF) circuit and FIG. 17B shows a circuit pattern thereof;

DESCRIPTION OF THE EMBODIMENTS

Figure 1:
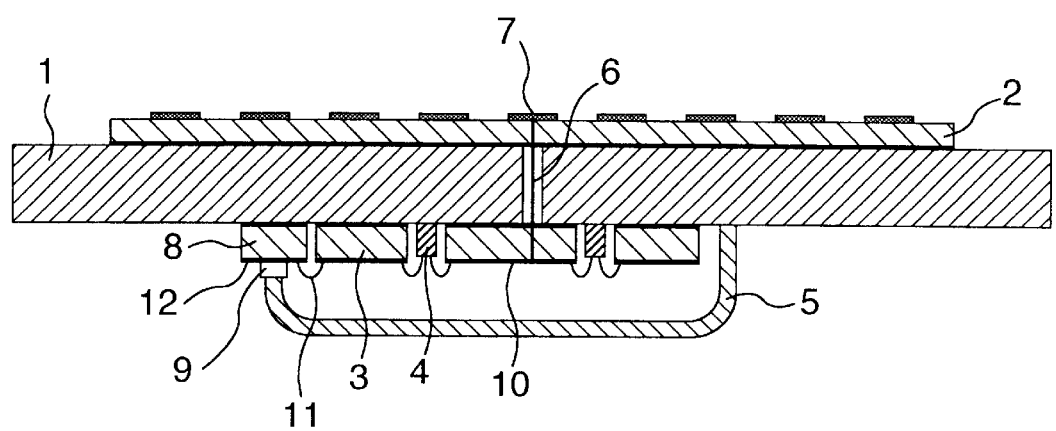
FIG. 1 is a sectional view showing a high-frequency transmitter-receiver apparatus according to an embodiment of the present invention.

The present invention will be described in detail in conjunction with what is presently considered as preferred or typical embodiments thereof by reference to the drawings, being understood that the present invention is never restricted to these embodiments but numerous modifications or changes in design can occur to those skilled in the art without departing from the ambit of the invention. In the following description, like reference characters designate like or corresponding or equivalent parts throughout the several views. Also in the following description, it is to be understood that such terms as "top", "bottom", "right", "left" and the like are words of convenience and are not to be construed as limiting terms. FIG. 1 is a sectional view showing a high-frequency transmitter-receiver apparatus according to an embodiment of the present invention. As can be seen from the figure, the high-frequency transmitter-receiver apparatus includes a base plate 1 made of a metal and having a top surface on which an antenna substrate 2 formed of a dielectric for constituting an antenna is bonded and a bottom surface on which a circuit substrate 3 formed of a dielectric for constituting a transmitter-receiver or transceiver circuit and a monolithic microwave integrated circuit semiconductor chip (hereinafter referred to as the MMIC semiconductor chip or simply as the semiconductor chip) 4 are mounted by bonding. Metal patterns 10 on the circuit substrate deposited on the surface of the circuit substrate 3 and metal patterns 7 on the antenna substrate deposited on the surface of the antenna substrate 2 are electrically connected to each other by a center conductor 6 of a coaxial line. Since the semiconductor chip 4 is not packaged, the transceiver circuit is hermetically sealed by means of a cover 5 of transceiver components made of a metal. Mounted locally on the transceiver component cover 5 are terminals 12 for the external connection to a power source and for an IF (intermediate frequency) signal, being electrically insulated from the conductor plate (base plate) and the transceiver component cover 5, respectively, by insulation materials 8 and 9. The terminals 12 for external connection (hereinafter referred to as the external terminal only for convenience of description) and the transceiver circuit on one hand and the circuit pattern conductor and the semiconductor chip on the other hand are interconnected by bonding wires 11. In this conjunction, it should however be mentioned that the semiconductor chip 4 may be electrically contacted directly onto the circuit substrate 3 in a so-called flip chip mount structure, as will be described later on by reference to FIG. 4. Further, the base plate 1 and the transceiver component cover 5 may be formed of a nonmetallic material such as plastic or the like with the surface thereof being coated with a metal through plating, evaporation or the like process.

Figure 2:
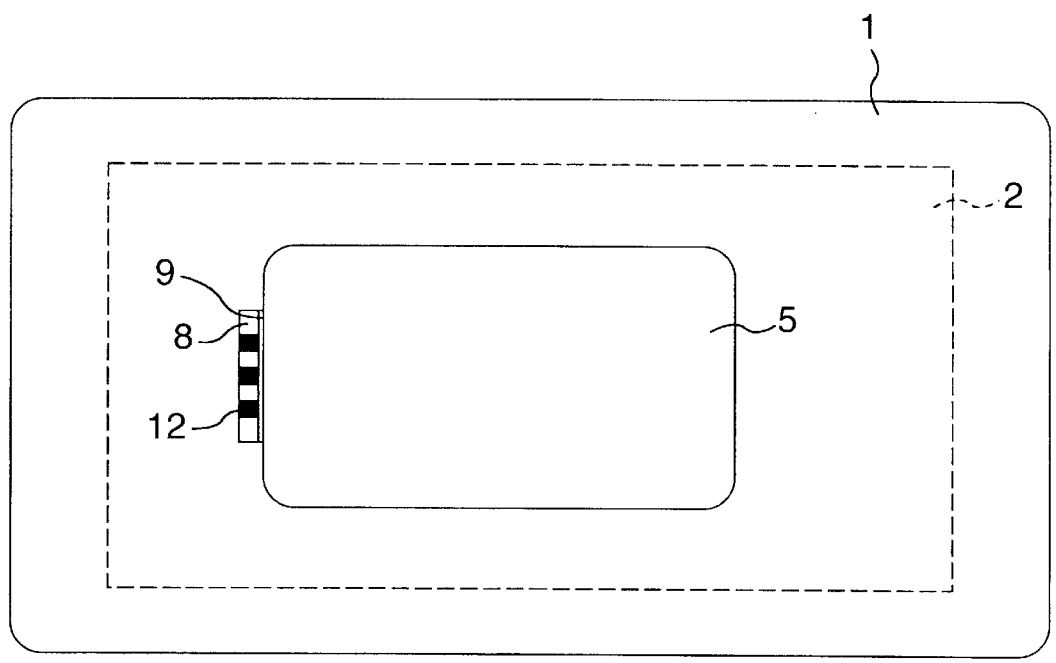
FIG. 2 is a bottom plan view of the high-frequency transmitter-receiver apparatus shown in FIG. 1.

FIG. 2 is a bottom plan view of the high-frequency transmitter-receiver apparatus, in which the antenna substrate 2 mounted on the top surface is indicated by a phantom line.

Figure 3:
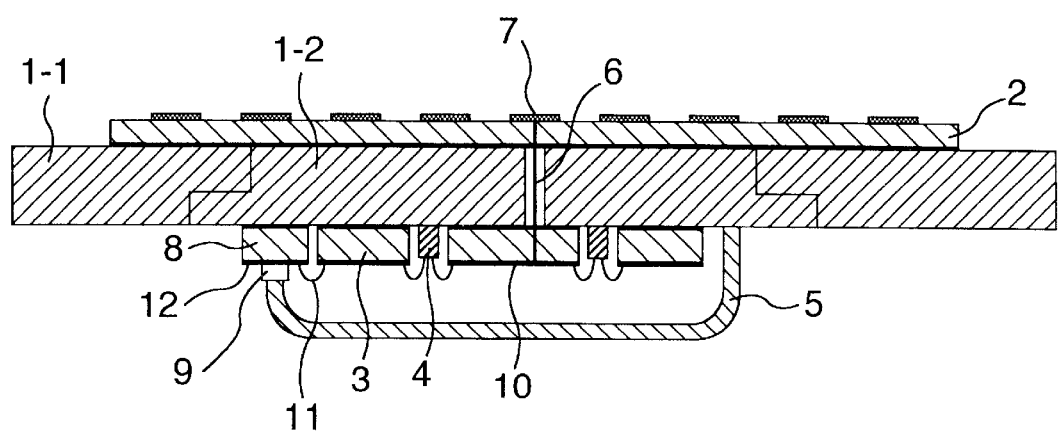
FIG. 3 is a sectional view showing a structure of a high-frequency transmitter-receiver apparatus according to another embodiment of the present invention.

FIG. 3 shows a structure of the high-frequency transmitter-receiver apparatus according to another embodiment of the invention, in which the base plate 1 is divided separately into a mid portion 1-2 where the transceiver circuit is provided and a peripheral portion 1-1. The mid portion 1-2 should be so dimensioned that at least the transceiver component cover 5 can be mounted. By realizing the base plate 1 in the divided structure, efficiency in assembling the high-frequency transmitter-receiver apparatus as a whole can be enhanced, provided that the area of the transceiver circuit is sufficiently small when compared with that of the antenna.

Figure 4:
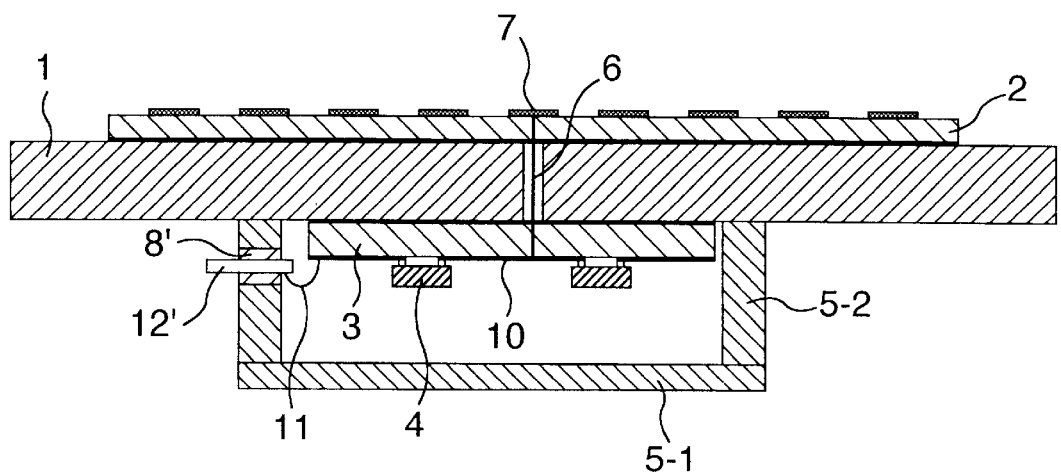
FIG. 4 shows in a sectional view a structure of a high-frequency transmitter-receiver apparatus according to still another embodiment of the present invention.

FIG. 4 shows in a sectional view another example of the structure of the high-frequency transmitter-receiver apparatus in which the transceiver component cover 5 is constituted by a side frame 5-2 and a cover sheet 5-1. Mounted at a location of the side frame 5-2 are pin terminals 12' for external connection, wherein the pin terminals 12' are electrically insulated by insulation material 8'. It can further be seen that the transceiver circuit is realized in a flip-chip package structure in which the MMIC semiconductor chip is mounted directly on the circuit substrate, as mentioned previously.

Figure 5:
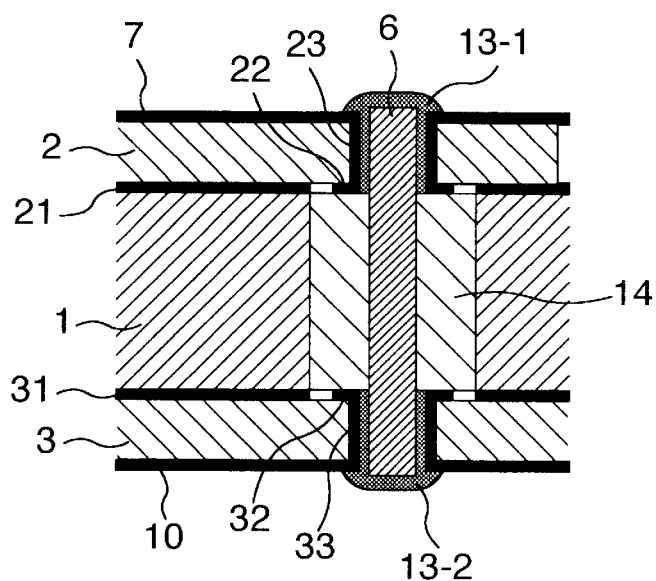
FIG. 5 is a fragmentary sectional view showing on an enlarged scale a structure around a coaxial line or cable in the high-frequency transmitter-receiver apparatus shown in FIG. 4.

FIG. 5 is a fragmentary sectional view showing on an enlarged scale the coaxial line (or coaxial cable, to say in another way) for electrically interconnecting the transceiver circuit and the antenna. Deposited on the antenna substrate 2 bonded onto the top surface of the base plate 1 are metal patterns 7 on antenna substrate and an ground conductor (or earth conductor) 21. On the other hand, metal patterns 10 on circuit substrate and a ground conductor (or earth conductor) 31 are deposited on the circuit substrate 3 which is bonded onto the bottom surface of the base plate 1. Electrical connection between the metal patterns 7 on antenna substrate and the metal patterns 10 on circuit substrate is established by means of the center conductor 6 supported by a dielectric 14 of the coaxial line and solders 13-1 and 13-2. In this conjunction, by using the coaxial line of the structure in which glass, ceramic or the like may be employed as the dielectric 14, airtightness can easily be ensured for the high-frequency transmitter-receiver apparatus inclusive of the semiconductor chip.

For realizing the connection between the center conductor 6 and the metal patterns 7 and 10, electrically conductive layers 23 and 33 may be deposited by plating or the like process on lateral surfaces of through-hole portions formed in the dielectric substrates (antenna substrate and circuit substrate) for inserting the center conductor therethrough. In this conjunction, the electrically conductive layers 23 and 33 formed on the lateral surfaces of the through-hole portions mentioned above may be extended so as to form lands 22 and 32 flush with the ground conductors 21 and 31, respectively, which is effective for protecting the lateral surface conductive layers from delamination. With the structure described above, the space defined between the dielectric substrate and the center conductor can be filled with solder essentially without any void owing to high-contact susceptibility of the metallic conductor and the solder. In this way, mechanical strength of the high-frequency transmitter-receiver apparatus according to the instant embodiment of the present invention can be increased. Thus, the high-frequency transmitter-receiver apparatus according to the invention can be protected against deterioration of the characteristics even when the apparatus is employed in a vehicle-onboard radar system. At this juncture, it should be added that unless the lateral surface conductive layers are provided, the current will flow along the solder surface and thus the loss due to roughness of the solder surface will not be negligible. By contrast, with the structure described above, the current can flow through the lateral surface conductive layers, whereby the electric loss can be suppressed to a minimum. Such advantageous effects can be observed especially in the millimeter wave region.

For soldering, a metal such as AuSn, AuSi or the like can be used as well. Further, for the connection of the coaxial line, welding, ribbon bonding or the like may be resorted to in addition to the soldering.

Figure 6:
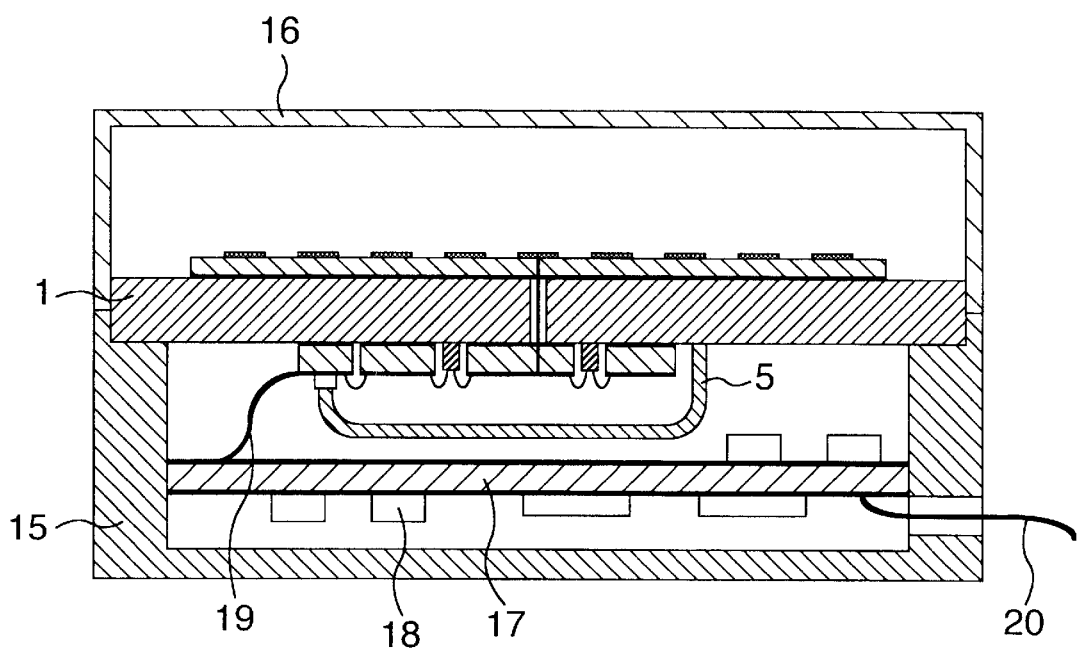
FIG. 6 is a sectional view showing an antenna unit incorporating a high-frequency transmitter-receiver device according to yet another embodiment of the present invention.

FIG. 6 is a sectional view of an antenna unit according to another embodiment of the present invention. The antenna unit according to the instant embodiment is comprised of a high-frequency transmitter-receiver apparatus or device described hereinbefore by reference FIGS. 1 to 4 which is integrally combined with a signal processing circuit. Referring to the figure, a signal processing circuit substrate 17 on which circuit components 18 such as those for a power source circuit and an IF signal processing circuit are mounted is disposed in the vicinity of the high-frequency transmitter-receiver device, wherein the high-frequency transmitter-receiver device and the signal processing circuit are electrically interconnected by a lead wire 19. An antenna cover 16 formed of a dielectric is mounted so as to cover the whole antenna array while a cover 15 of signal processing circuit made of a metal and covering wholly the transceiver circuit and the signal processing circuit is mounted directly on the base plate 1, wherein signal transfers with external apparatuses are realized through the medium of a lead terminal 20 for external connection. For mounting the signal processing circuit cover 15, airtightness is not required because the circuit components 18 are packaged.

Figure 7:
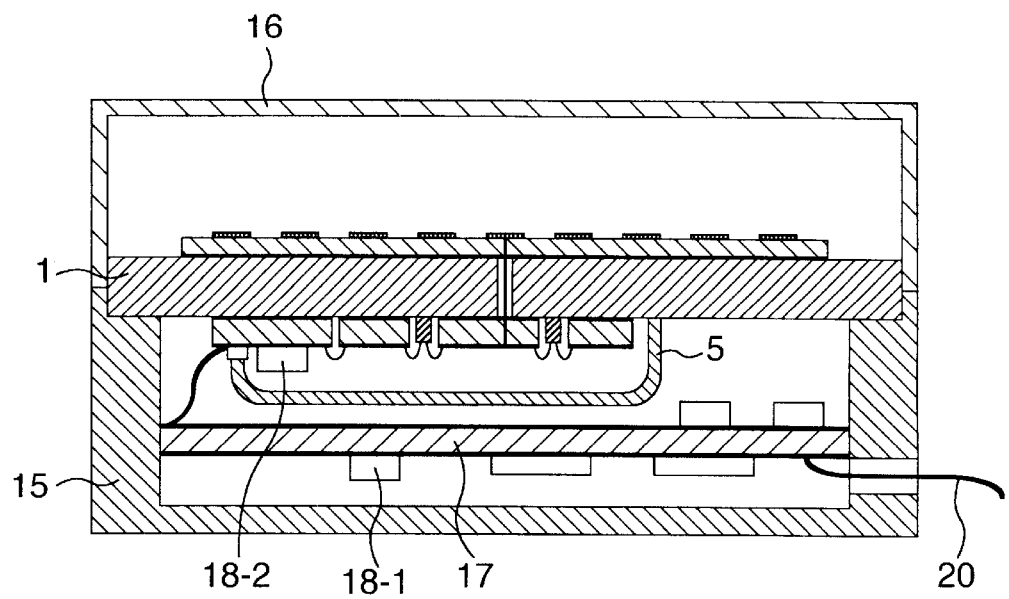
FIG. 7 is a sectional view showing another structure of the antenna unit incorporating a high-frequency transmitter-receiver device according to a further embodiment of the present invention.

FIG. 7 is a sectional view showing a modified structure of the antenna unit shown in FIG. 6. In this antenna unit, some of the circuit components 18 for the IF signal processing circuit such as an operational amplifier and/or other is accommodated within the space defined by the transceiver component cover 5 mounted hermetically, wherein the IF signal is taken out externally from the transceiver component cover 5 after having been amplified (i.e., after the signal level of the IF signal has been raised). Parenthetically, reference numeral 18-1 in FIG. 7 denotes the other parts or circuitries of the signal processing circuit. With the structure of the antenna unit shown in FIG. 7, the amplified IF signal is outputted from the transceiver circuit packaged hermetically. Thus, the IF signal is less susceptible to the influence of noise generated by the other signal processing circuit components 18-1 including digital circuitries, which means that improved S/N ratio can be ensured, to an advantage.

Figure 19:
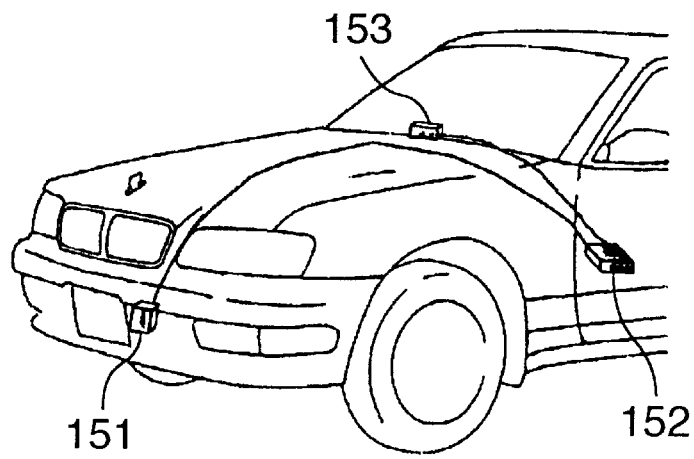
FIG. 19 is a view for illustrating pictorially a vehicle-onboard radar system.

By the way, at present, development of novel road traffic systems is being studied for practical applications with a view to solving the problems encountered in the road traffic such as traffic accidents, traffic jam and the like. As one of such road traffic systems, a vehicle-onboard radar system (i.e., radar equipment for automobiles or motor vehicles) is under development for measuring or ranging the distance to a fore-running motor vehicle from a motor vehicle equipped with a radar (hereinafter referred to as the subject motor vehicle only for convenience of description), detecting an obstacle on the road and so forth for thereby controlling appropriately operation of the subject motor vehicle. FIG. 19 is a pictorial view for illustrating schematically a configuration of such radar system.

Referring to FIG. 19, the radar system illustrated includes an antenna unit 151 designed for transmitting or sending out radio wave of millimeter-wave band and receiving echo returning from the fore-running motor vehicle or the obstacle to thereby detect difference between the frequency of the transmitted radio wave and that of the echo. Incidentally, it should be mentioned that the radio wave of the millimeter-wave band is less susceptible to the influence of weather conditions as compared with the infrared laser known heretofore and can thus ensure high accuracy for measurement of the inter-vehicle distance (i.e., distance between the fore-running motor vehicle and the subject motor vehicle).

On the basis of the difference between the frequency of the transmitted radio wave and that of the echo as detected, the relative running speed between the fore-running motor vehicle and the subject motor vehicle can be determined. Additionally, the inter-vehicle distance between the fore-running motor vehicle and the subject vehicle as well as the direction in which the fore-running motor vehicle is located, as viewed from the subject motor vehicle, can be detected. To this end, a signal processing unit 152 is provided for performing appropriate arithmetic processings on the output signal of the antenna unit 151 to thereby make decision as to the environmental situation for effectuating automatically controls required or desired for the subject motor vehicle such as throttle control, transmission control, brake control and/or the like. In addition to such automatic control of the motor vehicle, the ambient or environmental situations such as existence of obstacle, presence of a fore-running motor vehicle, relative speed between the fore-running motor vehicle and the subject motor vehicle should preferably be messaged to the operator or driver of the subject motor vehicle. Besides, an alarm should be issued to the driver as occasion requires. The signal processing unit 152 sends the relevant information to a driver display device 153 which is designed to execute relevant display processings and alarm message generating processing on the basis of the signals or information received from the signal processing unit 152.

In the radar system such as illustrated in FIG. 19, the signal processing unit and the antenna unit are provided discretely or separately from each other. However, it should be noted that both the signal processing unit and the antenna unit can be combined in a unitary structure by realizing the antenna unit in a miniaturized structure. Needless to say, integral combination of the signal processing unit and the antenna unit can facilitate mounting of the radar system on the motor vehicle or automobile.

As can be appreciated from the above, it is required that the antenna unit be mounted on the front or lateral side of the motor vehicle. To this end, the antenna unit should preferably be implemented in a small size at light weight. Besides, in consideration of vibrations of the motor vehicle to which the antenna unit is subjected in the course of running of the motor vehicle, a high mechanical strength should be ensured for the antenna unit.

Figure 8:
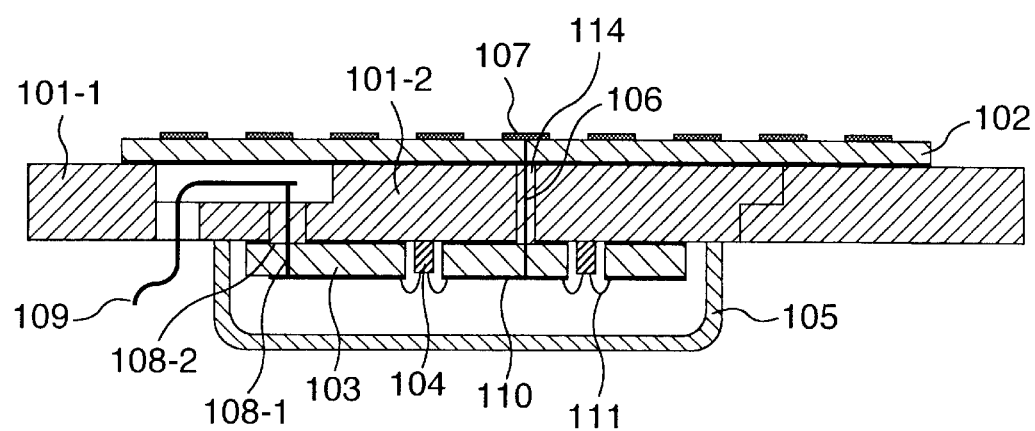
FIG. 8 is a sectional view showing a high-frequency transmitter-receiver apparatus which is designed for use in a vehicle-onboard radar system according to a still further embodiment of the present invention.

FIG. 8 is a sectional view showing a high-frequency transmitter-receiver apparatus which is designed for use in an antenna unit according to yet another embodiment of the present invention. As can be seen from the figure, the apparatus includes a base plate 101 (composed of sections 101-1 and 101-2) made of a metal and having a top surface on which an antenna substrate 102 formed of a dielectric for constituting an antenna is bonded and a bottom surface on which a circuit substrate 103 formed of a dielectric for constituting a transceiver circuit and an MMIC semiconductor chip 104 are mounted by bonding. Metal patterns 110 on circuit substrate deposited on the surface of the circuit substrate 103 and metal patterns 107 on antenna substrate deposited on the surface of the antenna substrate 102 are electrically connected to each other by an RF (radio frequency) coaxial line which is realized by a dielectric 114 and a metal center conductor 106. Since the MMIC semiconductor chip is not packaged, the transceiver circuit is hermetically sealed by means of a cover 105 of transceiver components made of a metal. The metal patterns 110 on circuit substrate and the semiconductor chips 104 are electrically interconnected by bonding wires 111. Parenthetically, the MMIC semiconductor chip 104 may be implemented in a so-called flip-chip package structure in which the MMIC semiconductor chip 104 is directly contacted onto the circuit substrate 103. Further, the base plate 101 and the transceiver component cover 105 may be formed of a nonmetallic material such as plastic or the like with the surface thereof being coated with metal through plating, evaporation or the like process.

The base plate 101 is divided separately into a peripheral portion 101-1 where the transceiver circuit is provided and a mid portion 101-2. The mid portion 101-2 should be so dimensioned as to include at least the area which is hermetically sealed by the transceiver component cover 105. By realizing the base plate 101 in the divided or separable structure, efficiency in assembling the high-frequency transmitter-receiver apparatus as a whole can be enhanced, provided that the area of the transceiver circuit is sufficiently small when compared with that of the antenna.

Figure 10A:
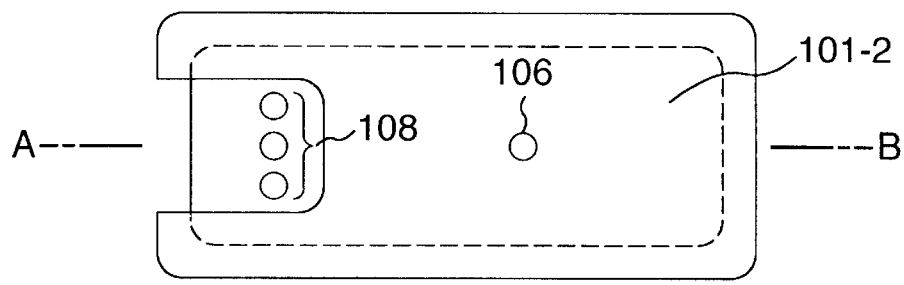
Figure 10B:
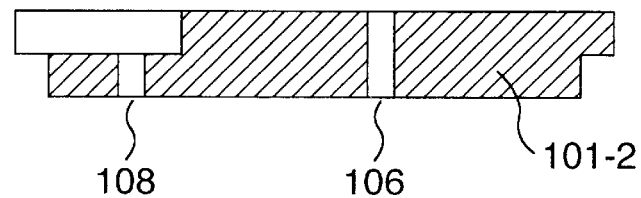

Provided at the mid portion 101-2 of the base plate substantially orthogonally to the plane of the antenna is a connecting terminal of a coaxial structure (hereinafter also referred to as the coaxial terminal) which is composed of a metal conductor 108-1 for the terminal and a dielectric 108-2 for the terminal and which serves as the power supplying terminal (D.C. bias supply terminal) and/or the IF (intermediate frequency) signal terminal. On the other hand, the mid portion 101-2 of the base plate is partially recessed in the surface on which the antenna substrate is bonded, as illustrated in FIGS. 10A and 10B. Within the recess formed in the base plate, the metal conductor 108-1 for the terminal is electrically connected to the lead wire 109 forming the terminal for external connection to be thereby connected to an external power supply circuit or a signal processing circuit also provided externally. Incidentally, when the high-frequency transmitter-receiver apparatus is equipped with two antennas, i.e., transmitting antenna and receiving antenna, there are required two coaxial terminals for interconnecting the transceiver circuit and these two antennas. Further, it should be mentioned that although the D.C. bias supply terminal or power supply terminal and the IF signal terminal are provided at one side of the housing, they may be provided at both sides. Of course, the invention is never restricted to any specific number of the terminals.

Figure 9:
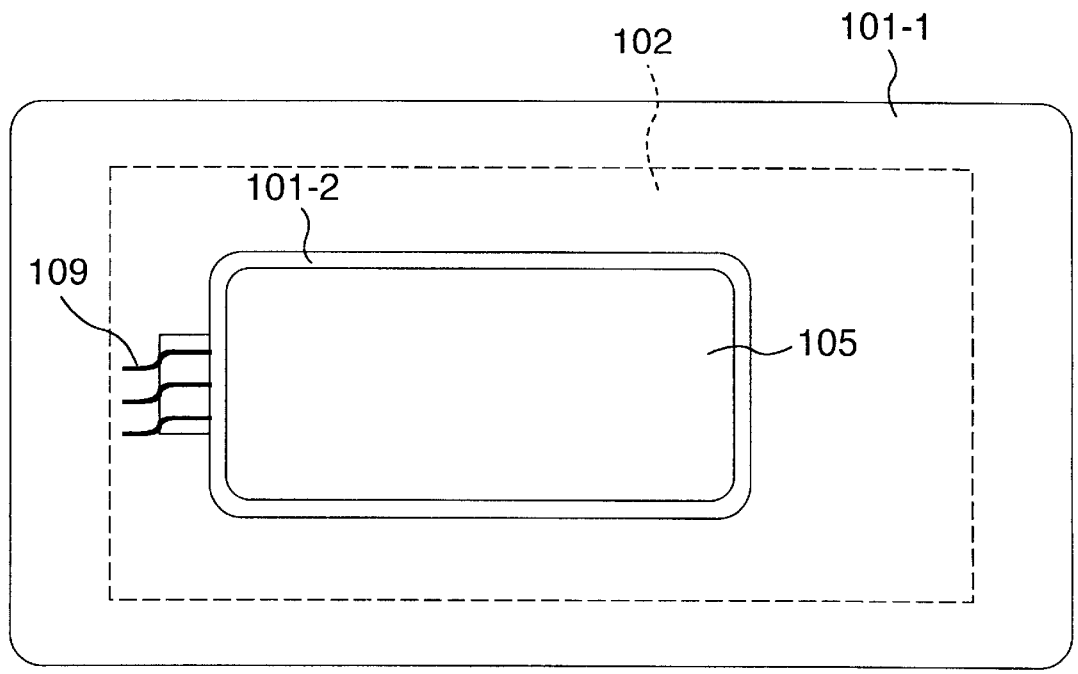
FIG. 9 is a bottom plan view of the high-frequency transmitter-receiver apparatus shown in FIG. 8.

FIG. 9 is a bottom plan view of the high-frequency transmitter-receiver apparatus according to the instant embodiment of the invention, in which the antenna substrate 102 bonded onto the top surface of the base plate is indicated by a phantom line.

FIGS. 10A and 10B show a structure of the mid portion 101-2 of the base plate according to an embodiment of the invention, in which FIG. 10A is a top plan view of the mid portion 101-2, and FIG. 10B is a sectional view of the same taken along a line A-B shown in FIG. 10A. Referring to the figures, numeral 106 denotes a through-hole for the coaxial line interconnecting the transceiver circuit and the antenna, and numeral 108 denotes through-holes for the coaxial terminals for the D.C. bias supply or power supply and the IF signal. As described hereinbefore, the surface of the mid portion 101-2 onto which the antenna substrate is bonded is partially recessed for accommodating signal lines extending from the coaxial terminal.

Figure 11:
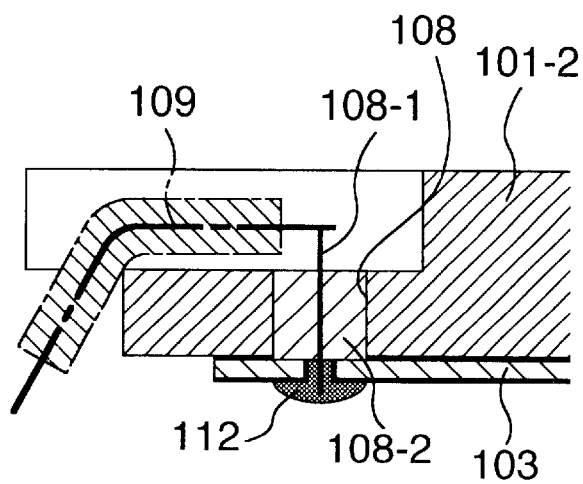
FIG. 11 is a partially enlarged sectional view for illustrating a structure around an IF (intermediate frequency) signal terminal (terminal of a coaxial structure) in a high-frequency transmitter-receiver apparatus according to another embodiment of the present invention.

FIG. 11 is a partially enlarged sectional view for illustrating a structure around the coaxial terminal (i.e., terminal of the coaxial structure). As can be seen in the figure, the dielectric substrate 103 constituting a part of the transceiver circuit is bonded onto the bottom surface of the mid portion 101-2 of the base plate. The through-hole 108 is formed in the dielectric substrate 103, and one end portion of the metal conductor 108-1 of the coaxial terminal is inserted into the through-hole to be subsequently connected to the pattern conductor of the transceiver circuit by soldering, as designated by numeral 112. The other end of the metal conductor 108-1 is connected to the lead wire (external terminal) 109 covered with an insulation coat. The lead wire 109 is connected to the signal processing circuit provided externally. When lots of terminals are to be provided, a flat cable or the like available commercially can be made use of as the lead wires. The dielectric 108-2 supporting the metal conductor 108-1 of the coaxial terminal may serve for electrical insulation. By using ceramic or glass as the dielectric 108-2, airtightness of the transceiver circuit can be enhanced with the reliability thereof being enhanced.

For forming the electric connection between the metal conductor 108-1 and the metal patterns on the transceiver circuit substrate, the lateral surface of the through-hole formed in the dielectric substrate 103 is coated with an electrically conductive layer through plating or the like process. Thus, the space defined between the dielectric substrate and the center conductor can be filled with solder without voids owing to the high contact susceptibility or affinity between the metal conductor and the solder, whereby the mechanical strength can be increased.

Figure 12:
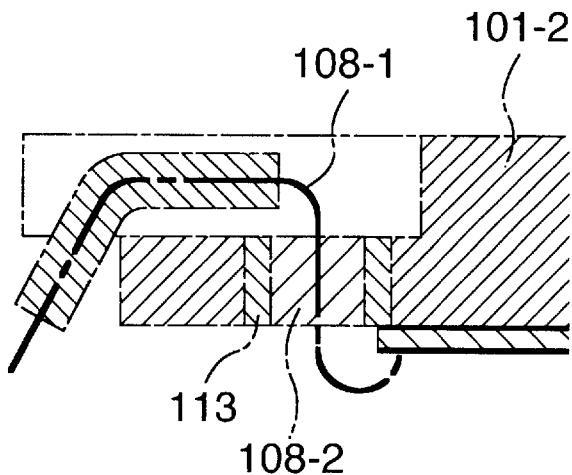
FIG. 12 is a sectional view showing on an enlarged scale another structure of an IF signal terminal (terminal of a coaxial structure) according to still another embodiment of the present invention.

FIG. 12 is a view showing a structure of the coaxial terminal according to still another embodiment of the invention. In this structure, one end portion of the metal conductor 108-1 is elongated so that the metal conductor 108-1 can serve as a lead wire for connection to the signal processing circuit provided externally, while the other end portion of the metal conductor 108-1 is connected to the pattern conductor of the transceiver circuit by a bonding wire. Further, in the case of the structure shown in FIG. 12, the coaxial terminal formed by using a metallic sleeve 113 of Kovar, iron or the like is provided separately to be connected to the mid portion 101-2 of the base plate by soldering or the like.

Figure 13:
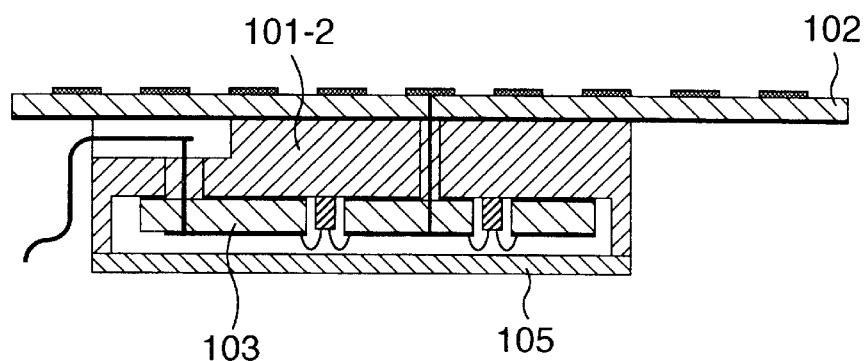
FIG. 13 is a sectional view of a high-frequency transmitter-receiver apparatus according to yet another embodiment of the present invention.

FIG. 13 is a sectional view of a high-frequency transmitter-receiver apparatus according to a further embodiment of the present invention. More specifically, the instant embodiment of the invention is directed to a structure of the high-frequency transmitter-receiver apparatus in which the mechanical strength as required can be sustained only by the antenna substrate because the area for the antenna is not excessively large or because the antenna substrate is thick. Thus, the base plate is not divided into the peripheral portion 101-1 and the mid portion 101-2, and the antenna substrate 102 is directly mounted on the base plate 1 in a region corresponding to the mid portion 101-2.

Figure 14:
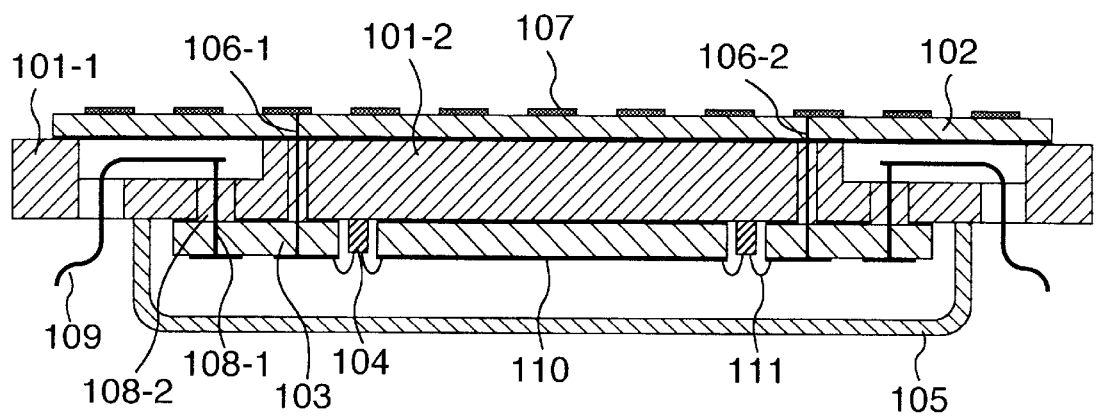
FIG. 14 is a sectional view of a high-frequency transmitter-receiver apparatus according to a further embodiment of the present invention.

FIG. 14 is a sectional view of a high-frequency transmitter-receiver apparatus of a structure in which an transmitting antenna and a receiving antenna are provided separately from each other according to another embodiment of the present invention. In the high-frequency transmitter-receiver apparatus now under consideration, the power supplying terminal and the terminal for the IF signal are provided at right and left end portions, respectively, as viewed in the figure, wherein high-frequency (RF) coaxial lines 106-1 and 106-2 for establishing connection between the antenna pattern conductors (metal patterns) and the high-frequency circuit pattern conductor (metal patterns) are provided discretely at two locations, i.e., at left-hand and right-hand sides, as viewed in the figure.

Figure 15A:
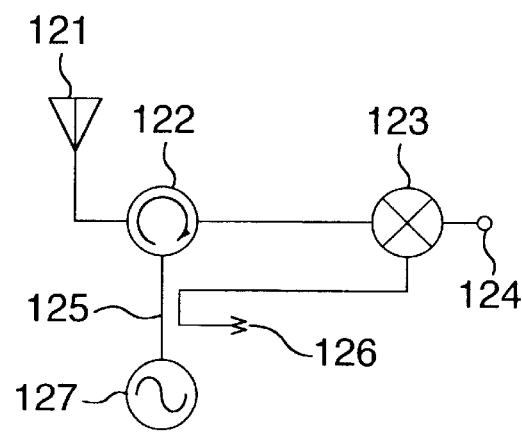
Figure 15B:
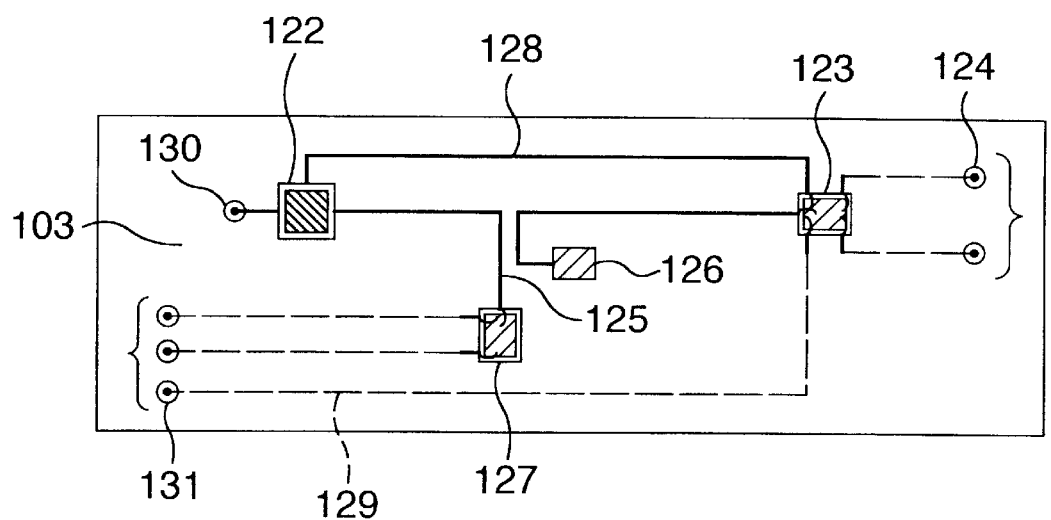

FIGS. 15A and 15B show yet another structure of the high-frequency transmitter-receiver apparatus according to an embodiment of the invention in which an antenna is employed common to transmission and reception, wherein FIG. 15A is a circuit diagram of a high-frequency (RF) circuit arrangement and FIG. 15B shows an RF circuit pattern provided on a dielectric substrate 103. Referring to FIG. 15A, an RF (radio frequency) signal generated by an oscillator 127 is fed to an antenna 121 via a circulator 122. Since the antenna 121 is used for signal transmission and reception, the received RF signal, i.e., echo signal, is applied to the mixer 123 via the circulator 122. On the other hand, the RF signal generated by the oscillator 127 is supplied to the mixer 123 as a local oscillation signal via a coupler 125, whereby the received RF signal or echo is converted into an IF (intermediate frequency) signal, which is taken out from an IF signal terminal 124. A resistor 126 serves to stably operate the coupler 125.

Next referring to FIG. 15B, the RF signal generated by the oscillator 127 implemented in the form of an MMIC semiconductor chip is applied to an RF coaxial terminal 130 which interconnects the RF circuit and the antenna through a microstrip line 128 and the circulator 122. Supplied to the individual MMIC semiconductor chips is a D.C. power or D.C. bias from the D.C. bias supply terminals 131 through a D.C. bias supply line 129 (shown by a phantom line) deposited on the dielectric substrate 103.

As can be seen in FIG. 15B, the D.C. bias supply terminals 131 and the IF signal terminals 124 should preferably be disposed at locations in the vicinity of opposite sides (right and left sides as viewed in the figure) of the dielectric substrate 103, respectively, so that the IF signal lines and the D.C. bias supply lines do not extend in parallel. In case the IF signal lines and the power supply lines extend in parallel, the IF signal may undergo interference by the noise carried by the D.C. bias supply line. Thus, when it is necessary in view of the circuit layout to provide the IF signal line and the D.C. bias supply line so that they extend in parallel with each other, a ground conductor (earth conductor) should be disposed between the D.C. bias supply line and the IF signal line for thereby preventing or suppressing the noise carried by the former from leaking to the latter.

Figure 16A:
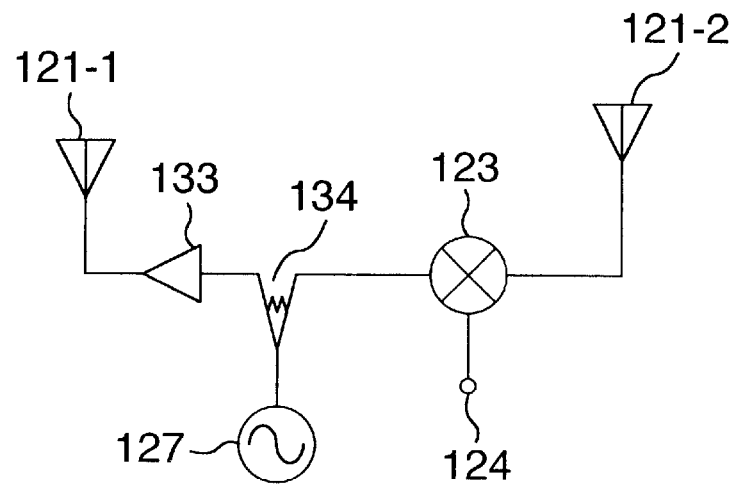
Figure 16B:
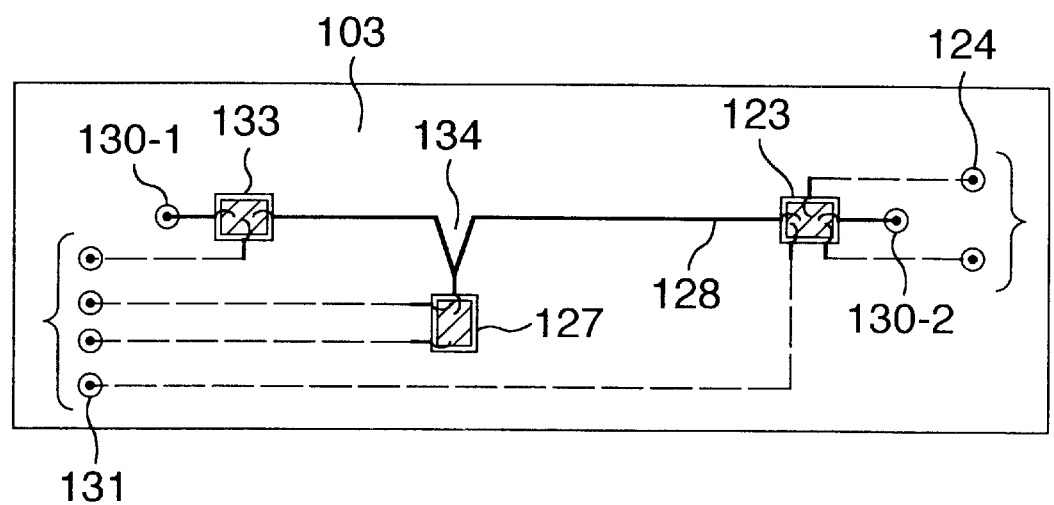

FIGS. 16A and 16B show a structure of the high-frequency transmitter-receiver apparatus according to another embodiment of the invention in which a transmitting antenna and a receiving antenna are provided separately from each other, wherein FIGS. 16A is a circuit diagram showing a high-frequency (RF) circuit arrangement and FIG. 16B shows a corresponding RF circuit pattern. Referring to FIG. 16A, an RF (radio frequency) signal generated by an oscillator 127 is sent out from a transmitting antenna 121-1 through an RF amplifier 133 via a distributor 134. The RF echo received by a receiving antenna 121-2 is supplied to a mixer 123. Additionally, a part of the RF signal generated by the oscillator 127 is also supplied to the mixer 123 as a local oscillation signal via the distributor 134. Referring to FIG. 16B, the RF signal outputted from the oscillator 127 which is realized in the form of an MMIC semiconductor chip is supplied through a microstrip line 128 to an RF coaxial terminal 130-1 interconnecting the RF circuit and the transmitting antenna, while the signal received by the receiving antenna is applied to the mixer 123 implemented in the form of an MMIC semiconductor chip via an RF coaxial terminal 130-2.

Figure 17A:
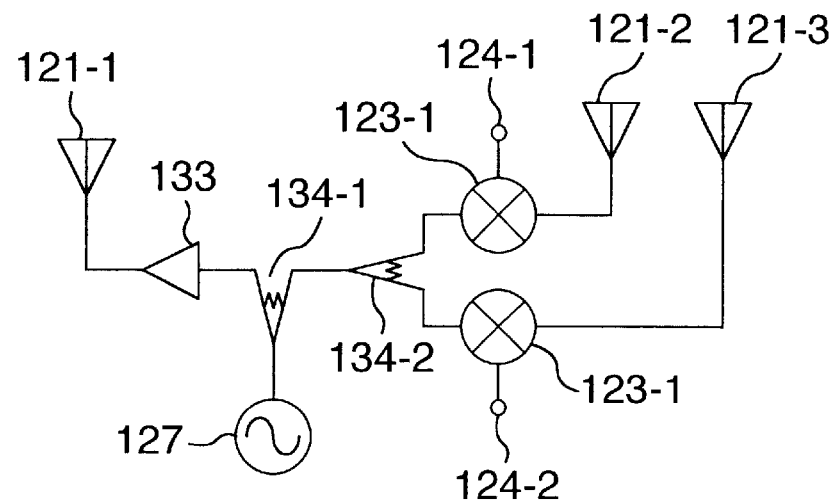
Figure 17B:
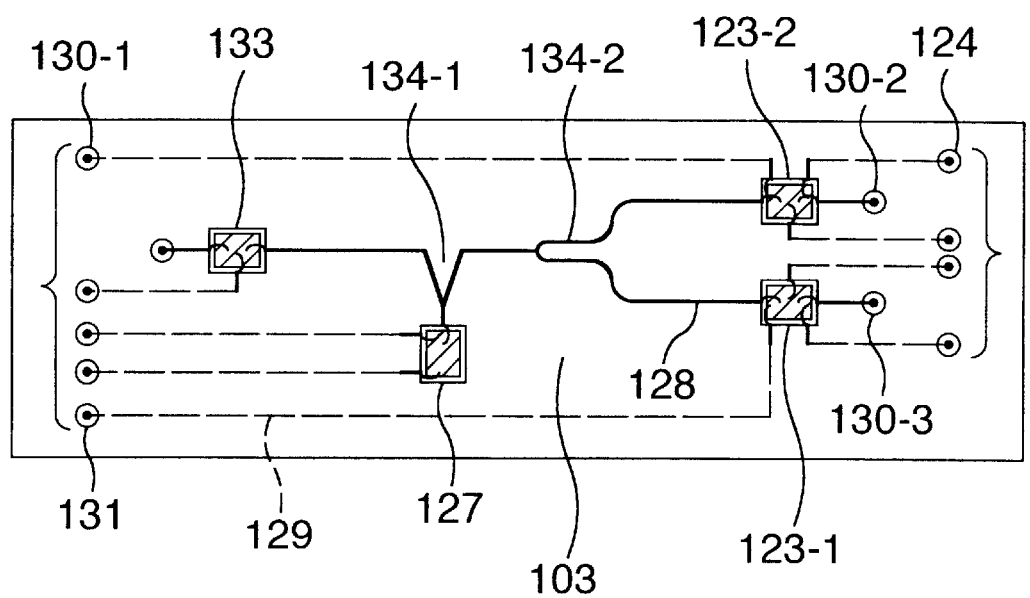
Figure 18:
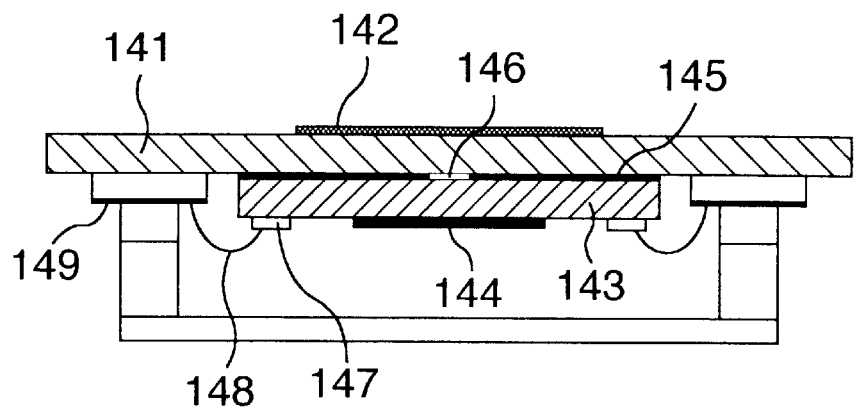
FIG. 18 is a sectional view showing a conventional high-frequency transmitter-receiver apparatus known heretofore.

FIGS. 17A and 17B show a high-frequency transmitter-receiver apparatus according to still another embodiment of the present invention in which the transmitting antenna and the receiving antenna are provided separately from each other and in which a plurality of receiving antennas are provided in order to catch with high accuracy the direction in which a forerunning motor vehicle and/or obstacle exists. More specifically, FIG. 17A shows an exemplary RF circuit arrangement while FIG. 17B shows a corresponding RF circuit pattern. Referring to FIG. 17A, an RF signal generated by an oscillator 127 is sent out from a transmitting antenna 121-1 through an RF amplifier 133 via a distributor 134-1. On the other hand, the RF echoes as received by a plurality of transmitting receiving antennas 121-2 and 121-3 are supplied to mixers 123-1; 123-2. Additionally, a part of the RF signal generated by the oscillator 127 is also supplied to the mixers 123-1 and 123-2 as a local oscillation signal via distributors 134-1 and 134-2, respectively. Referring to FIG. 17B, the RF signal outputted from the oscillator 127 which is realized in the form of a semiconductor chip is supplied through a microstrip line 128 to an RF coaxial terminal 130-1 interconnecting the RF circuit and the transmitting antennas, while the echoes received by the receiving antennas are applied to the mixers 123-1 and 123-2 each implemented in the form of a semiconductor chip via RF coaxial terminals 130-2 and 130-3, respectively.

In the case of the high-frequency transmitter-receiver apparatuses shown in FIGS. 16B and 17B, respectively, the IF signal terminals 124 and the D.C. bias supply terminals 131 are provided at locations near to the opposite sides of the dielectric substrate 103, respectively, to thereby prevent the IF signal lines and the D.C. bias supply lines from extending in parallel.

As is apparent from the foregoing, according to the teachings of the invention, there can be realized a unitary structure of the high-frequency transmitter-receiver apparatus in which the transceiver circuit and the antenna are combined integrally, which is very advantageous in that not only the characteristics can be improved but also the number of parts can be significantly reduced and additionally the apparatus as a whole can be miniaturized.

Further, it can be understood that according to the present invention, the efficiency of work involved in assembling the high-frequency transmitter-receiver apparatus can be enhanced while ensuring airtightness thereof by virtue of such arrangement that the coaxial terminal which may have a same structure as the coaxial line interconnecting the transceiver circuit and the antenna is used as the connecting terminal for electrically interconnecting the transceiver circuit and the external terminal.

What is claimed is:

1. A transmitter-receiver apparatus, comprising:
   a base plate;
   a transceiver circuit provided on a first surface of said base plate; and
   an antenna provided on a second surface of said base plate opposite to said first surface on which said transceiver circuit is provided,
   wherein said transceiver circuit and said antenna are electrically connected to each other through a coaxial line which extends through said base plate.

2. A transmitter-receiver apparatus according to claim 1, wherein said coaxial line comprises a dielectric material formed in a through-hole in said baseplate between said first and second surfaces and a central conductor formed in said dielectric material.

3. A transmitter-receiver apparatus according to claim 2, wherein the length of said dielectric material is substantially equal to the thickness of said base plate between said first and second surfaces.

4. A transmitter-receiver apparatus according to claim 3, wherein the transceiver circuit is formed on a circuit substrate and the antenna is formed on an antenna substrate, and wherein the length of said central conductor of said coaxial line is substantially equal to the thickness of said base plate plus the combined thicknesses of said circuit substrate and said antenna substrate.

5. A transmitter-receiver apparatus according to claim 1, wherein said coaxial line is formed integrally with said base plate.

6. A transmitter-receiver apparatus according to claim 5, wherein said coaxial line comprises a dielectric material formed in a through-hole in said baseplate between said first and second surfaces and a central conductor formed in said dielectric material.

7. A transmitter-receiver apparatus according to claim 6, wherein the length of said dielectric material is substantially equal to the thickness of said base plate between said first and second surfaces.

8. A transmitter-receiver apparatus according to claim 7, wherein the transceiver circuit is formed on a circuit substrate and the antenna is formed on an antenna substrate, and wherein the length of said central conductor of said coaxial line is substantially equal to the thickness of said base plate plus the combined thicknesses of said circuit substrate and said antenna substrate.

9. A transmitter-receiver apparatus comprising:
a base plate;
a transceiver circuit provided on a first surface of said base plate; and
an antenna provided on a second surface of said base plate opposite to said first surface on which said transceiver circuit is provided,
wherein said transceiver circuit and said antenna are electrically connected to each other through a coaxial line which extends through said base plate;
wherein said transceiver circuit includes a metal circuit pattern provided on a first dielectric substrate and a semiconductor chip connected to said metal circuit pattern, and
wherein said antenna includes a metal antenna pattern provided on a second dielectric substrate.

10. A transmitter-receiver apparatus according to claim 9,
wherein said coaxial line includes a center conductor which extends through a through-hole formed so as to extend through said base plate, said first dielectric substrate and said second dielectric substrate and which is electrically connected to said metal circuit pattern and said metal antenna pattern, respectively, and
wherein lateral surfaces of said through-hole formed in said first dielectric substrate and said second dielectric substrate, respectively, are provided with electrically conductive layers which extend from said metal circuit pattern and said metal antenna pattern, respectively.

11. A high-frequency transmitter-receiver apparatus comprising a high-frequency transceiver circuit including an oscillator, an amplifier and a mixer circuit and an antenna for transmitting and receiving a high-frequency signal,
wherein high-frequency circuits including the oscillator, the amplifier and the mixer circuit are each implemented in a planar circuit structure by using an dielectric substrate and a semiconductor chip, while said antenna is implemented in a planar antenna structure by using a dielectric substrate,
wherein said dielectric substrate constituting a part of said planar circuit structure and said dielectric substrate constituting a part of said planar antenna structure are directly bonded on first and second surfaces, respectively, of a single electrically conductive base plate, said first and second surfaces being opposite to each other, and
wherein high-frequency signal lines of said planar circuit and said planar antenna, respectively, are interconnected by an coaxial line extending through said base plate.

12. A high-frequency transmitter-receiver apparatus according to claim 11,
wherein a mid portion of said base plate where said transceiver circuit is provided and other portion of said base plate are divided so as to be separable from each other.

13. A high-frequency transmitter-receiver apparatus according to claim 11,
wherein those portions of said coaxial line at which said coaxial line is to be connected, respectively, to the dielectric substrate constituting a part of said planar circuit structure and the dielectric substrate constituting a part of said planar antenna structure are realized in an airtight structure by using a dielectric including glass or ceramic which constitutes a part of said coaxial line.

14. A high-frequency transmitter-receiver apparatus according to claim 11,
wherein at those portions of said coaxial line where said coaxial line is connected to said planar circuit structure and said planar antenna structure, respectively, lateral surfaces of through-hole portions through which a center conductor of said coaxial line extends and which are formed in the dielectric substrate constituting a part of said planar circuit structure and the dielectric substrate constituting a part of said planar antenna structure, respectively, are coated with an electrically conductive layer including a plated layer.

15. An antenna unit incorporating a high-frequency transmitter-receiver device including high-frequency circuits having an oscillator, an amplifier and a mixer circuit and implemented in a planar circuit structure by using a dielectric substrate and a semiconductor chip and an antenna implemented in a planar antenna structure by using a dielectric substrate, said dielectric substrate constituting a part of said planar circuit structure and said dielectric substrate constituting a part of said planar antenna structure being directly bonded on first and second surfaces, respectively, of a single electrically conductive base plate, said first and second surfaces being opposite to each other, wherein high-frequency signal lines of said planar circuit and said planar antenna, respectively, are interconnected by an coaxial line extending through said base plate,
wherein said high-frequency circuits are enclosed by an electrically conductive cover mounted directly on said base plate, and
wherein terminals for D.C. bias supply and for intermediate-frequency signal are provided in said electrically conductive cover in a portion thereof, said terminals being electrically insulated from said cover.

16. An antenna unit according to claim 15,
wherein a portion of a circuit for processing the intermediate-frequency signal outputted from said high frequency transceiver circuit is accommodated within said electrically conductive cover in addition to said high-frequency transceiver circuit.

17. An antenna unit according to claim 15,
wherein a cover made of a dielectric for enclosing the antenna as a whole is provided at a side where said antenna is provided, said cover being mounted directly on the base plate, while an electrically conductive cover enclosing the transceiver circuit, a D.C. bias supply circuitry, an intermediate-frequency circuit and other circuitries is mounted directly on the base plate at the other side.

18. A high-frequency transmitter-receiver apparatus, comprising:
a base plate;
an antenna provided on a first surface of said base plate;
a transceiver circuit provided on a second surface of said base plate opposite to said first surface and electrically connected to said antenna; and
a terminal for external connection provided on said second surface of said base plate for supplying a source current to said transceiver circuit or outputting a signal;
wherein said base plate being provided with a concave portion in said first surface and covered with said antenna and a through-hole extending through said concave portion and said second surface,
wherein a connecting terminal for supplying a source current to said transceiver circuit or outputting a signal extends through said through-hole and electrically connected to said external terminal in said concave portion, and
wherein said connecting terminal is implemented in a line structure having a metal conductor electrically insulated from said base plate in said through-hole.

19. A high-frequency transmitter-receiver apparatus according to claim 18,
wherein said connecting terminal is implemented in an airtight structure by using a dielectric including glass or ceramic for electrically insulating the core conductor of said connecting terminal from said base plate.

20. A high-frequency transmitter-receiver apparatus according to claim 18,
wherein a connecting line constituted by a cylindrical metallic sleeve as an outer electrical conductor, a dielectric provided internally of said sleeve and a metal conductor provided internally of said sleeve is employed for interconnection of said connecting terminal or said antenna and said transceiver circuit.

21. A high-frequency transmitter-receiver apparatus, comprising:
a base plate;
an antenna provided on a first surface of said base plate;
a transceiver circuit provided on a second surface of said base plate opposite to said first surface and electrically connected to said antenna;
a first terminal array for external connection provided on said second surface of said base plate for supplying a source current to said transceiver circuit; and
a second terminal array for external connection provided on said second surface of said base plate for outputting an electric signal,
wherein a first connecting terminal inter-connecting said transceiver circuit and said first terminal for the external connection on one hand and a second connecting terminal for interconnecting said transceiver circuit and said terminal for the external connection on the other hand are provided, respectively, at different locations close to sides of a substrate on which said transceiver circuit is formed.

22. A high-frequency transmitter-receiver apparatus, comprising:
a base plate;
an antenna provided on a first surface of said base plate;
a transceiver circuit provided on a second surface of said base plate opposite to said first surface and electrically connected to said antenna;
a first terminal array for external connection provided on said second surface of said base plate for supplying a source current to said transceiver circuit; and
a second terminal array for external connection provided on said second surface of said base plate for outputting an electric signal,
wherein said high-frequency transmitter-receiver apparatus further comprises:
first lines for interconnecting first connecting terminals connected to said first terminal array and circuit components of said transceiver circuit; and
second lines for interconnecting second connecting terminals connected to said second terminal array and circuit components of said transceiver circuit,
wherein said first and second lines are so provided as not to extend in parallel with each other.

23. A high-frequency transmitter-receiver apparatus, comprising:
a base plate;
an antenna provided on a first surface of said base plate;
a transceiver circuit provided on a second surface of said base plate opposite to said first surface and electrically connected to said antenna;
a first terminal array for external connection provided on said second surface of said base plate for supplying a source current to said transceiver circuit; and
a second terminal array for external connection provided on said second surface of said base plate for outputting an electric signal,
wherein said high-frequency transmitter-receiver apparatus further comprises:
first lines for interconnecting first connecting terminals connected to said first terminal array and circuit components of said transceiver circuit;
second lines for interconnecting second connecting terminals connected to said second terminal array and circuit components of said transceiver circuit, and
a ground conductor provided between said first lines and said second lines.

24. A high-frequency transmitter-receiver apparatus of an integrated structure, comprising a high-frequency transceiver circuit including an oscillator, an amplifier and a mixer circuit and an antenna for sending/receiving a high-frequency signal, wherein high-frequency circuits including the oscillator, the amplifier and the mixer circuit and said antenna are provided on first and second surfaces of a single electrically conductive base plate, said first and second surfaces being opposite to each other,
wherein high-frequency signal lines of said high-frequency circuit and said antenna are electrically interconnected by means of a coaxial line which extends through said base plate, and wherein a connecting terminal for connecting said high-frequency circuit to an external circuit including a power source circuit and a signal processing circuit is implemented in a line structure having a metal conductor electrically insulated from said base plate and disposed in such orientation as to extend partially through said base plate so that a lead-out portion of a lead wire interconnecting said high-frequency circuit and said external circuit is provided on said second surface on which said antenna is provided.

25. A high-frequency transmitter-receiver apparatus according to claim 24, wherein said connecting terminal for said external circuit is implemented in an airtight structure by using a dielectric including glass or ceramic for electrically insulating the core conductor of said connecting terminal from said base plate.

26. A high-frequency transmitter-receiver apparatus according to claim 24, wherein outer conductors of said coaxial line for interconnecting said high-frequency circuit and said antenna and said connecting terminal for connection with the external circuit are each formed of a cylindrical metal sleeve of Kovar, iron or the like with the core conductor and insulation material being disposed within said sleeve, whereby each of said coaxial line and said connecting terminal being implemented as discrete parts, respectively, which are mounted on said base plate by a process including welding.

27. A high-frequency transmitter-receiver apparatus according to claim 24, wherein the core conductor of the line for connection with the power source circuit or the signal processing circuit is extended to be connected directly to a terminal of said power source circuit or said signal processing circuit.

28. A high-frequency transmitter-receiver apparatus according to claim 24, wherein a lead wire which connects the metal conductor of the line for connection with the power source circuit or the signal processing circuit to a terminal of said power source circuit or said signal processing circuit is implemented in the form of flat cable covered with an insulation coat and mounted by welding or the like process so that the lead wire can be led out in a direction along the surface of said base plate.

29. A vehicle-onboard radar system mounted on a motor vehicle for generating control information for said motor vehicle, comprising:

an antenna unit for transmitting a radio wave of a high frequency to receive an echo wave of said high frequency for thereby detecting difference in frequency between said radio wave transmitted and said echo received; and a signal processing unit for determining an environmental situation of said motor vehicle on the basis of the detected frequency difference for generating control information for said motor vehicle, wherein said antenna unit comprises an antenna for sending out said high-frequency radio wave and a transceiver circuit for generating said high frequency and detecting said frequency difference, said antenna and said transceiver circuit being disposed on opposite surfaces, respectively, of a base plate, and wherein said antenna and said transceiver circuit are is electrically interconnected by means of a coaxial line extending through said base plate.

30. A vehicle-onboard radar system according to claim 29, wherein said coaxial line comprises a dielectric material formed in a through-hole in said base plate and a central conductor formed in said dielectric material.

31. A vehicle-onboard radar system according to claim 30, wherein the length of said dielectric material is substantially equal to the thickness of said base plate.

32. A vehicle-onboard radar system according to claim 29, wherein the transceiver circuit is formed on a circuit substrate and the antenna is formed on an antenna substrate, and wherein the length of said central conductor of said coaxial line is substantially equal to the thickness of said base plate plus the combined thicknesses of said circuit substrate and said antenna substrate.

33. A vehicle-onboard radar system according to claim 29, wherein said coaxial line comprises a dielectric material formed in a through-hole in said baseplate between said first and second surfaces and a central conductor formed in said dielectric material.

34. A vehicle-onboard radar system according to claim 33, wherein said coaxial line comprises a dielectric material formed in a through-hole in said base plate and a central conductor formed in said dielectric material.

35. A vehicle-onboard radar system according to claim 34, wherein the length of said dielectric material is substantially equal to the thickness of said base plate.

36. A vehicle-onboard radar system according to claim 35, wherein the transceiver circuit is formed on a circuit substrate and the antenna is formed on an antenna substrate, and wherein the length of said central conductor of said coaxial line is substantially equal to the thickness of said base plate plus the combined thicknesses of said circuit substrate and said antenna substrate.

37. A vehicle-onboard radar system mounted on a motor vehicle for generating control information for said motor vehicle, comprising:

an antenna unit for transmitting a radio wave of a high frequency to receive an echo wave of said high frequency for thereby detecting difference in frequency between said radio wave transmitted and said echo received; and a signal processing unit for determining environmental situation of said motor vehicle on the basis of the detected frequency difference for generating control information for said motor vehicle, wherein said antenna unit comprises an antenna for sending out said high-frequency radio wave and a transceiver circuit for generating said high frequency and detecting said frequency difference, said antenna and said transceiver circuit being disposed on opposite surfaces, respectively, of a base plate, and wherein a first external terminal array for supplying a source current to said transceiver circuit and a second external terminal array for outputting information indicating said frequency from said transceiver circuit are disposed along different sides, respectively, of said base plate.

* * * * *